United States Patent [19]

Shibata et al.

[11] Patent Number: 5,461,327
[45] Date of Patent: Oct. 24, 1995

[54] PROBE APPARATUS

[75] Inventors: Junichiro Shibata, Urawa; Hiroshi Marumo, Kofu; Gakuji Sasamoto, Enzan, all of Japan

[73] Assignees: Tokyo Electron Limited, Tokyo; Tokyo Electron Yamanashi Limited, Nirasaki, both of Japan

[21] Appl. No.: 113,741

[22] Filed: Aug. 31, 1993

[30] Foreign Application Priority Data

Aug. 31, 1992 [JP] Japan .................................... 4-231171
Sep. 9, 1992 [JP] Japan .................................... 4-265541
Sep. 10, 1992 [JP] Japan .................................... 4-268130

[51] Int. Cl.$^6$ .................................................. G01R 31/02
[52] U.S. Cl. ..................... 324/760; 324/158.1; 324/72.5; 324/73.1
[58] Field of Search ............................ 324/158 P, 158 F, 324/72.5, 158 R, 760, 158.1, 72.5

[56] References Cited

U.S. PATENT DOCUMENTS

| 3,493,858 | 1/1966 | Baron | 324/72.5 |
| 3,979,671 | 9/1976 | Meeker | 324/158 F |
| 4,510,445 | 4/1985 | Kvaternik | 324/158 P |
| 4,633,175 | 12/1986 | Ritchie | 324/158 R |
| 5,081,415 | 1/1992 | Liu | 324/158 P |
| 5,172,053 | 12/1992 | Itoyama | 324/158 P |
| 5,198,753 | 3/1993 | Hamburgen | 324/158 P |
| 5,325,052 | 6/1994 | Yamashita | 324/760 |

FOREIGN PATENT DOCUMENTS

| 63-31130 | 2/1988 | Japan . |
| 3-24743 | 2/1991 | Japan . |
| 4-77674 | 3/1992 | Japan . |

*Primary Examiner*—Kenneth A. Wieder
*Assistant Examiner*—Mark A. Wardas
*Attorney, Agent, or Firm*—Oblon, Spivak, McClelland, Maier & Neustadt

[57] ABSTRACT

A probe apparatus tests the electrical characteristics of chips formed on a semiconductor wafer by bringing probes into contact with pads of each chip. The probes, which include ones for power supply potentials, signals, and ground potential, are mounted vertically penetrating a ring block which is attached to the center of a main PCB of a probe card. A tray containing a number of fuses is mounted over the probe card by means of struts. The fuses in the tray connect wires of the main PCB, to which the supply potential of a DC power source is applied, and their corresponding probes. The fuses and the tray can be collectively removed from the probe card to be replaced with new ones.

10 Claims, 6 Drawing Sheets

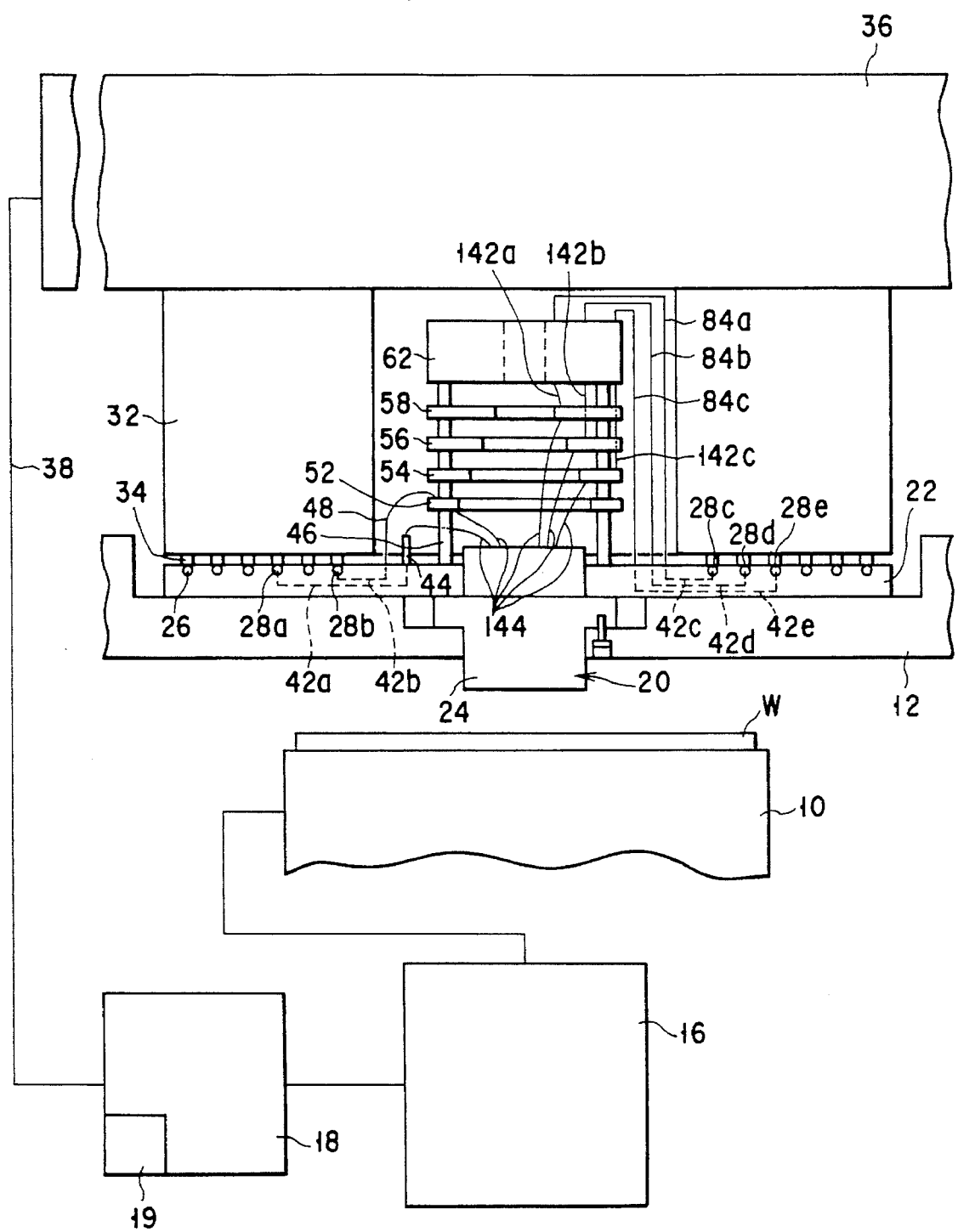
F I G. 1

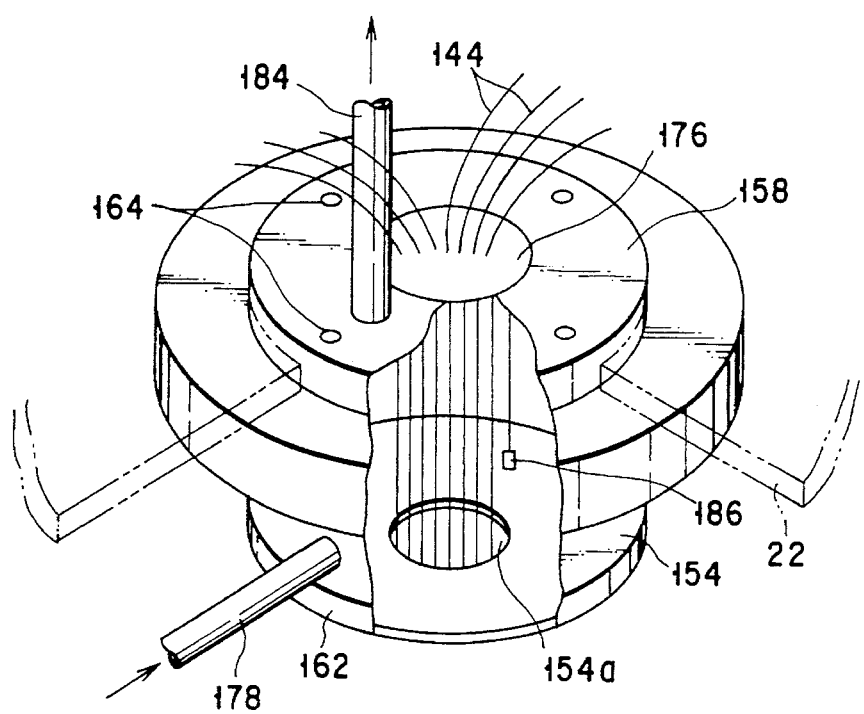
F I G. 7
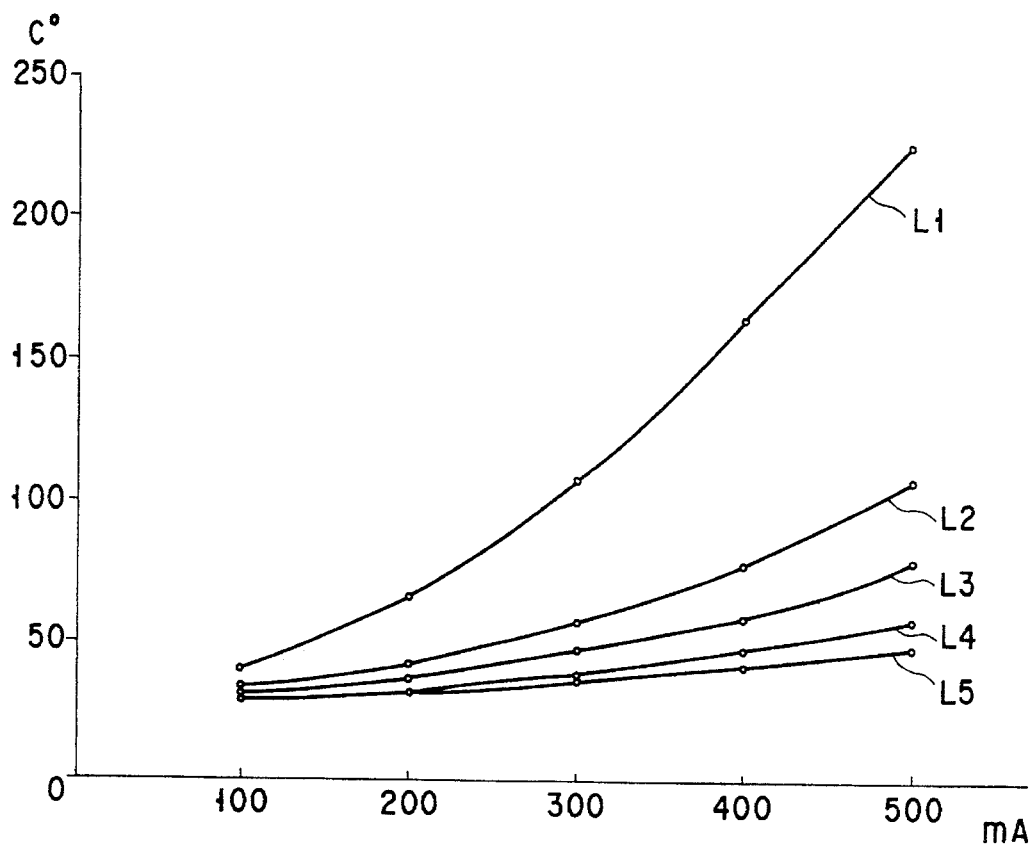
F I G. 8

PROBE APPARATUS

BACKGROUND OF THE INVENTION

1. Field of the Invention

The present invention relates to a probe apparatus, and more particularly, to a probe apparatus for testing the electrical properties of a semiconductor device, such as an integrated circuit, formed in a semiconductor wafer or LCD substrate, by bringing probes of a probe card into contact with electrode pads of the device.

2. Description of the Related Art

In general, the probe apparatus of this type comprises a mount supporting a substrate, such as a wafer, and movable in the horizontal and vertical directions, and a probe card located over the mount. The probe card is provided with a number of probes which are to be in contact with electrode pads of a semiconductor chip or test object.

The probe card is connected electrically to a test head overlying it by means of pogo pins and the like. The test head, which is rotatable around a hinge portion, can move between a testing position and a retreated position. Also known is an arrangement such that the test head is supported for up-and-down motion by means of a manipulator.

There are probe cards of the so-called horizontal and vertical types. A horizontal-type probe card is arranged such that the respective proximal ends of probes are soldered to a conductor pattern formed on the lower surface of a printed board, and the free ends of the probes are centralized. A vertical-type probe card is arranged such that the respective distal ends of probes are vertically guided through the central portion of a printed board to the underside thereof, and are bundled and isolated electrically from one another by means of a resin material.

Although horizontal-type probe cards have conventionally enjoyed higher popularity in the field, it is difficult, in this type, to enhance the integration of the probes. Recently, therefore, vertical-type probe cards, which are suited for higher-integration probe arrangement, have been becoming prevailing.

With the development of higher-integration versions of semiconductor integrated circuits, the number of devices for each semiconductor chip and the switching speed increase, thus entailing higher power consumption. Probe cards for testing these higher-integration, higher-consumption integrated circuits require use of many probes for supply potentials, as well as probes for the contact with signal terminals of the integrated circuits. In the case of a probe card having a total of 1,500 probes, for example, about 500 of these probes are used for the supply potentials.

In testing a high-consumption integrated circuit chip by using a probe card with a lot of probes, however, if that terminal of the integrated circuit which is connected to a supply potential is shorted to the ground side, for example, electric current is concentrated on that probe which is in contact with the shorted terminal, thereby fusing the probe. If any of the probes is broken, then the whole probe card becomes of no use.

Thereupon, various probe apparatuses have recently been proposed in which fuses are interposed between probes and a power source, as shown in Published Unexamined Japanese Patent Application Nos. 63-31130 and 3-24743. These probe apparatuses are designed such that the fuses are arranged on a printed board or substrate of the probe card and in the middle of conductor patterns. Accordingly, blown fuses cannot be replaced with high efficiency. If the probes used are increased in number, moreover, it becomes difficult to mount a corresponding number of fuses on the printed board.

SUMMARY OF THE INVENTION

Accordingly, an object of the present invention is to provide a probe apparatus in which fuses interposed between probes and a power source can be replaced with ease.

Another object of the invention is to provide a probe apparatus in which probes can be prevented from overheating.

Still another object of the invention is to provide a probe apparatus capable of detecting overheating of probes and quickly stopping test in case of overheating.

According to the present invention, there is provided a probe apparatus for testing the electrical characteristics of a semiconductor device, formed on a substrate, by bringing probes, arranged corresponding to electrode pads of the semiconductor device, into contact with the pads, comprising: support means for supporting the substrate; a probe card including the probes and a main circuit board having first and second wiring means, the probes at least including power supply potential probes and a signal probe; means for relatively moving the probe card and the support means toward and away from each other; transmitting means for delivering a power supply potential supplied by a DC power source and a signal sent by a tester to the first and second wiring means, respectively; means for supplying a reference potential of the DC power source to the semiconductor device; fuse holding means supported by the probe card; a plurality of fuses supported in the fuse holding means; first connecting means for connecting the fuses and the first wiring means to which the power supply potential is applied; second connecting means for connecting the fuses and the power supply potential probes; third connecting means for connecting the signal probe and the second wiring means to which the signal is applied; and mounting means for removably attaching the fuse holding means, along with the fuses, to the probe card.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a side view schematically showing a probe apparatus according to a first embodiment of the present invention;

FIG. 7 is a perspective view showing the probe card of the apparatus according to the first embodiment;

FIG. 8 is a graph showing the relationships between current flowing through probes, cooling gas flow, and probe temperature.

DETAILED DESCRIPTION OF THE PREFERRED EMBODIMENT

Figure 2:
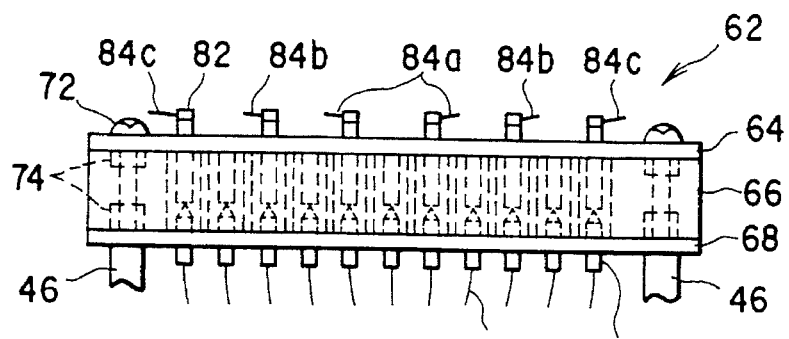
FIG. 2 is a side view showing a fuse box of the apparatus.

Referring to FIG. 1, there is shown a probe apparatus according to a first embodiment of the present invention, which is applied to a vertical-type probe card.

The probe apparatus comprises a mount 10 which includes a vacuum chuck. A semiconductor wafer W is attractively held on the mount 10. Formed on the semiconductor wafer W are a number of semiconductor chips, in which are incorporated semiconductor devices or test objects each having a number of electrode pads. The mount 10 is movable in the horizontal (x and Y) and vertical (Z) directions and rotatable around its central axis (θ). As the mount 10 is rotated and moved in the horizontal direction, the semiconductor wafer W is moved integrally therewith so that the electrode pads are aligned with the respective distal ends of probes, which will be mentioned later. As the mount 10 is moved in the vertical direction, the semiconductor wafer W is moved up and down integrally therewith so that the electrode pads and the probe tips are brought into contact with or isolated from one another. The mount 10 is controlled by means of a main control unit or CPU 16.

The mount 10 is overlain by a support ring 12 which is fixed to the casing of the apparatus, and a probe card 20 is fixed to the ring 12 by means of a screw or the like. The card 20 comprises a ring-shaped main printed-circuit board (PCB) 22, which includes an insulating substrate and a conductor wiring pattern thereon, and a ring block 24 which is attached to the main PCB 22 so as to be coaxial with a circular opening in the center of the PCB 22. Formed on the main PCB 22 are pogo seats 26 which are composed a number of conductors. The pogo seats 26 are arranged corresponding individually to pogo pins 34 which are arranged on the underside of a pogo pin ring 32 for applying voltage and signals to the probe card 20.

The pogo pin ring 32 is connected to an electric circuit in a test head 36 by means of a performance board on the lower surface of the head 36. The test head 36 is connected to a tester 18 through a bundle of leads 38. The tester 18 is controlled by means of the CPU 16.

Some pairs of a pogo seat 28 and a pogo pin 34 are used to transmit signals from the tester 18 to the probe card 20. For example, a signal pogo seat 28a is connected to a connecting post 44 by means of a wire 42a in the wiring pattern on the PCB 22. The wire 42a and wires 42b, 42c, 42d and 42e (mentioned later) are all in the wiring pattern on the PCB 22. In FIG. 1, however, these wires are represented by broken lines on the side face of the PCB 22 for ease of illustration. In FIG. 1, moreover, only the one signal pogo seat 28a and one connecting post 44 are illustrated typically. Actually, however, the seats 28a and posts 44 as many as signal lines are arranged on the PCB 22.

Further, some pairs of a pogo seat 28 and a pogo pin 34 are used to apply high and low potentials from constant-voltage DC power sources 19 built in the tester 18, that is, power supply potentials and ground potential or reference potential according to the present embodiment, to the probe card 20. The supply potentials and ground potential are applied to the probe card 20 in the following manner.

A plurality of struts 46 are fixed to the periphery of the center opening of the main PCB 22. A grounding PCB 52, first, second, and third connecting PCBs 54, 56 and 58, and a fuse box 62, which are arranged from bottom to top, are supported by means of the struts 46. Each of the PCBs 52 to 58 and the fuse box 62 has a horizontal outline of a circular ring, and is located coaxially with the center opening of the main PCB 22. The respective center openings of the PCBs 52 to 58 are designed so that they become greater with distance from the top, as shown in FIG. 1, in order to facilitate the passage of the probes (mentioned later).

The wire 42b from a grounding pogo seat 28b is connected to the grounding PCB 52 by means of a cable 48 for the application of the ground potential. In FIG. 1, only the one grounding pogo seat 28b and one cable 48 are illustrated typically. Actually, however, the seats 28b and cables 48 as many as ground lines, e.g., eight in number, are arranged on the PCB 22.

Figure 4:
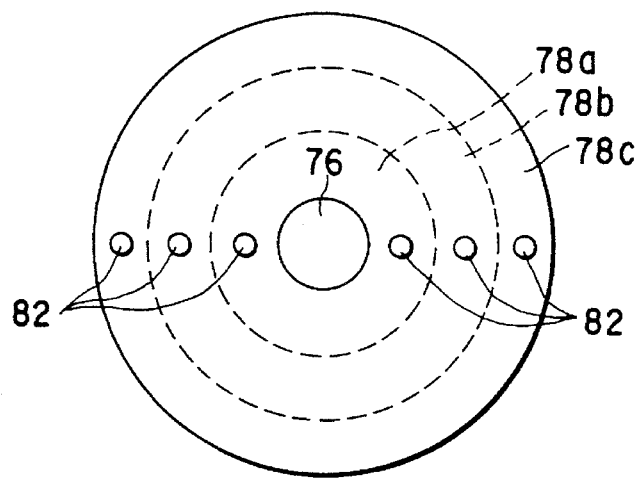
FIG. 4 is a plan view showing the top face of the fuse box.

As shown in FIG. 2, the fuse box 62 comprises a lid 64, a fuse tray 66, and a pogo pin supporting baseplate 68. These members are detachably assembled by means of through screws 72 which penetrate the lid 64 and engage with internal screw portions of the baseplate 68. Projections 74 are formed on the lid 64 and the baseplate 68, corresponding individually to mounting portions for the screws 72. The projections 74 are fitted in their corresponding recesses formed in the tray 66. Thus, the lid 64, tray 66, and baseplate 68 can be accurately aligned with one another. Besides the projections 74 and the recesses, combinations of aligning guide pins and guide holes may be provided between the individual members. The baseplate 68 is fixed to the respective upper ends of the struts 46, whereby the fuse box 62 is supported on the upper ends of the struts 46. As shown in FIG. 4, an opening or through hole 76 is formed in the center of the box 62.

The lid 64 is provided with an insulating substrate 84 which has a conductor layer 88 formed on the lower surface thereof. As shown in FIG. 4, the conductor layer 88 is formed of first, second, and third coaxial ring-shaped regions 78a, 78b and 78c which are isolated from one another, corresponding individually to three different supply potentials. Pairs of terminals 82 are arranged on the lid 64, corresponding individually to the regions 78a to 78c. Each terminal 82 is connected to the conductor layer 88 on the lower surface of the insulating substrate 84 by means of a through hole connector 86 in the substrate 84. Also, conductor bumps 94 are arranged on the lower surface of the substrate 84, corresponding individually to fuses 92 contained in the box 62. One of the supply potentials is applied to each bump 94 through the conductor layer 88.

Each terminal 82 is connected to one of cables 84a, 84b and 84c which correspond to the three supply potentials. In other words, the cables 84a to 84c are provided in pairs according to the present embodiment. In order to supply the individual potentials, the cables 84a, 84b and 84c are connected to wires 42c, 42d and 42e from pogo seats 28c, 28d and 28e for the supply potentials, respectively.

The tray 66 is formed of an insulating block which has a number of bores 96 which are aligned individually with the bumps 94 of the lid 64. The fuses 92 are contained in the bores 96, individually. The top portion of each bore 96 opens with the same diameter as the inner part thereof so that the fuse 92 can be loaded and unloaded through it. A through hole 98 smaller in diameter than the fuse 92 is formed in the bottom of bore 96, penetrating the base of the tray 66.

The baseplate 68 is formed on an insulating plate which has a number of pogo pins 102 arranged corresponding individually to the bores 96 of the tray 66. Each pogo pin 102 includes a basal portion 104 fixed to the baseplate 68 and a movable terminal 108 which is elastically supported on the basal portion 104 by means of a conductor spring 106. The tip end of the terminal 108 projects into the bore 96 through the hole 98 such that the terminal 108 is subjected to the elastic force of the spring 106.

When the lid 64, tray 66, and baseplate 68 are assembled together with the fuses 92 in the bores 96, as shown in FIG. 2, each fuse 92 is pushed up elastically by the terminal 108 of its corresponding pogo pin 102 so that its top portion is in contact with the corresponding bump 94. The fuses 92 are commercially available fuses having a predetermined fusing current value. The top and bottom portions of each fuse serve as terminals 112a and 112b, respectively. More specifically, the terminals 112a and 112b of each fuse 92 are brought into contact with the bump 92 and the terminal 108, respectively, whereby electrical conduction between the bump 94 and the pogo pin 102 is established.

Figure 3:
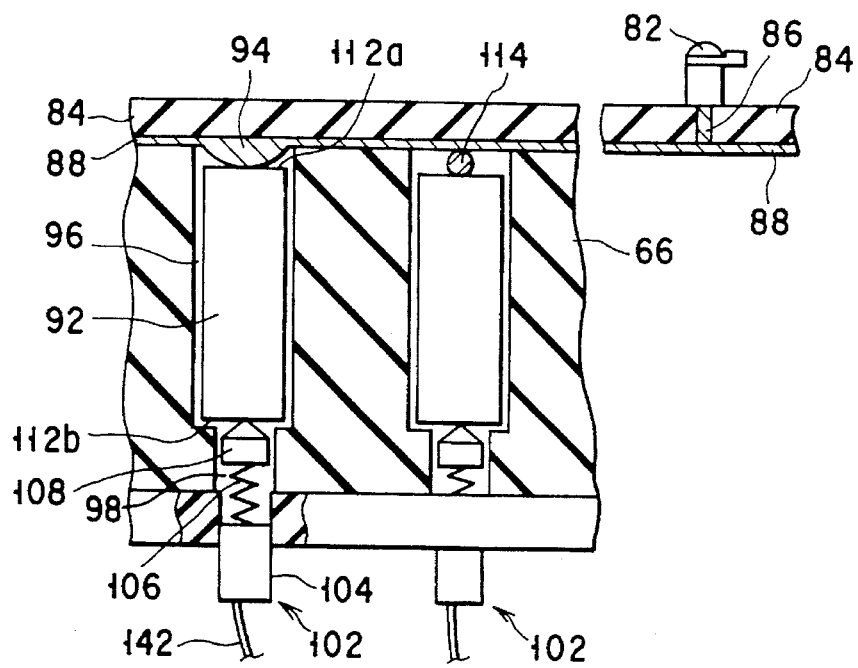
FIG. 3 is an enlarged partial sectional view showing fuses set in place.

As in the right-hand bore shown in FIG. 3, the bump 94 for the conduction between the terminal 112a of each fuse 92 and the conductor layer 88 may be replaced with a ball 114 made of a conductor such as gold. Although the process of forming the bumps 94 during the manufacture can be omitted, in this case, an operator must take care not to lose the balls 114 when the lid 64 is removed.

Figure 5:
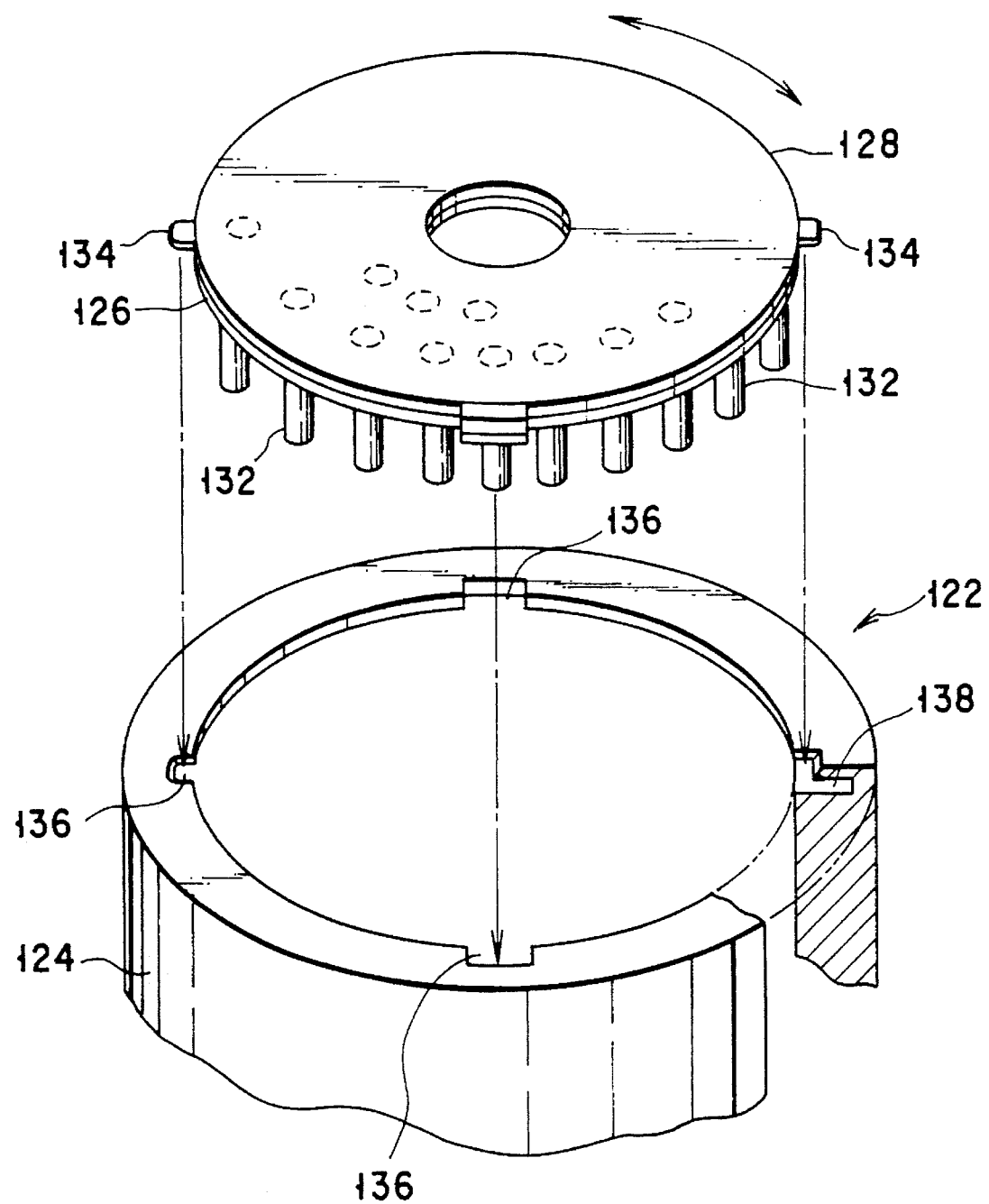
FIG. 5 is a perspective view showing a modification of the fuse box.

FIG. 5 is a perspective view showing a modification of the fuse box. In a fuse box 122 according to this modification, a casing 124 is fixed to the respective upper portions of struts 46, and a baseplate of the casing 124 is constructed in the same manner as the baseplate 68 shown in FIGS. 2 and 3. A fuse tray 126 and a lid 128 can be removably attached to the casing 124 at a time by bayonet coupling. The tray 126 is provided with a number of open-topped tubes 132. The tray 126 and the lid 128 are aligned by means of guide pins and guide holes provided therefor. The tray 126 and the lid 128 are designed such that four engaging pieces 134 are formed on the peripheral edge when they are assembled. Formed on the upper portion of the casing 124, on the other hand, are notches 136 for receiving the pieces 134 and engaging grooves 138 for the pieces 134. Instead of using the bayonet coupling, a conventional rocking hook member may be used to removably fix the tray 126 and the lid 128 to the casing 124.

Returning to FIGS. 1 to 3, the pogo pins 102 of the fuse box 62 are connected to the connecting PCBs 54 to 58 by means of cables 142. Those pogo pins 102 which are connected to the first, second, and third regions 78a, 78b and 78c of the lid 64 are connected to the third, second, and first connecting PCBs 58, 56 and 54 by means of cables 142a, 142b and 142c, respectively. Probes 144, each formed of a conductor such as gold, are attached individually to wiring patterns on the respective lower surfaces of the connecting PCBs 54 to 58. In the present embodiment, each wire connected to three probes 144 communicates with one of the fuses 92. In other words, each fuse 92 is used to control overcurrent flowing through three probes 144.

Also, probes 144, each formed of a conductor such as gold, are attached to the grounding PCB 52 and the signal connecting posts 44, and are connected electrically to their corresponding lines. All the probes 144 for the supply potentials, ground potential, and signals, 1,500 in total, penetrate the ring block 24 of the probe card 20, and project from the block 24 with their respective distal end portions 146 (see FIG. 6) extending in the vertical direction. The distal end portions 146 of the probes 144 are arranged corresponding individually to the electrode pads of the semiconductor chips, in which the semiconductor devices or test objects are incorporated.

Figure 6:
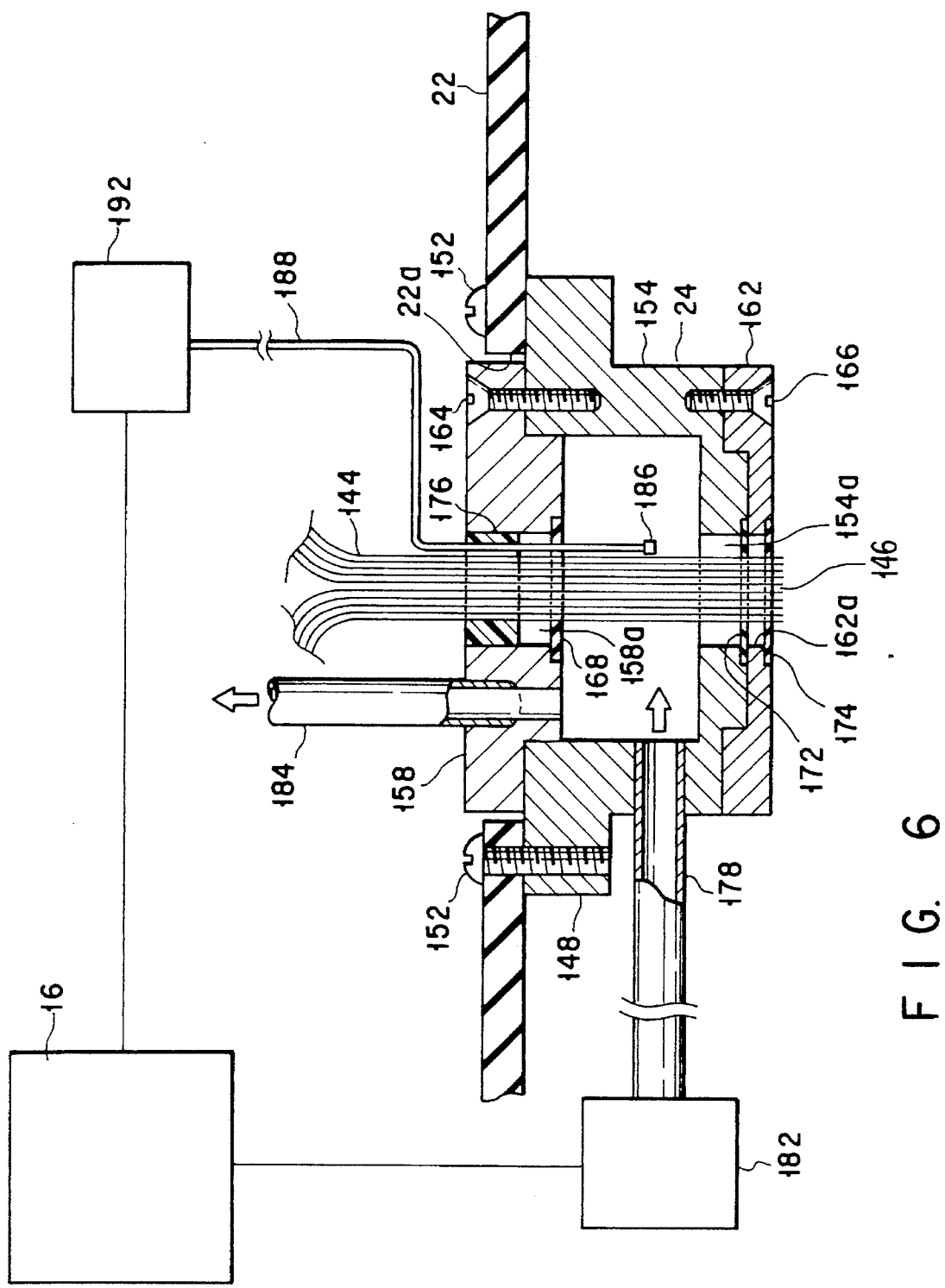
FIG. 6 is a sectional view showing a probe card of the apparatus according to the first embodiment.

As shown in FIGS. 6 and 7, the ring block 24 is located so as to be coaxial with the circular opening 22a in the center of the main PCB 22 of the probe card 20. The block 24 has a flange 148, which is fixed to the PCB 22 by means of screws 152. The block 24 comprises a cup-shaped intermediate ring 154 having a through hole 154a in the center of its base, an upper ring 158 fitted in an upper opening of the ring 154, and a protective cover 162 fitted on the underside of the ring 154. The upper ring 158 and the protective cover 162 are fastened by means of screws 164 and 166, respectively, after being fitted on the intermediate ring 154.

Further, openings 158a and 162a, which have the same diameter as the through hole 154a of the intermediate ring 154, are formed in the central portions of the upper ring 158 and the protective cover 162, respectively. A first guide plate 168 is attached to the lower side of the through hole 158a of the upper ring 158, while second and third guide plates 172 and 174 are attached to the upper and lower sides, respectively, of the through hole 162a of the protective cover 162. The guide plates 168, 172 and 174, which are formed of an insulating material, have a number of fine holes for vertically guiding the numerous probes 144 without contact with one another.

The probes 144 are introduced from the upper-ring side into the internal space of the block 24 through the first guide plate 168. Further, the probes 144 are guided out of the lower-surface side of the block 24 through the second and third guide plates 172 and 174. Having their distal end portions 146 trued up, the probes 144 are held in position by means of a bonding agent 176 of synthetic resin, such as epoxy resin, filling the through hole 158a of the upper ring 158.

The block 24 is designed so that its internal space can be utilized as a cooling chamber for the probes 144. A cooling gas supply unit 182 is connected to the side wall of the intermediate ring 154 by means of a pipe 178. A discharge pipe 184 is connected to the upper ring 158. A thermocouple 186 for use as temperature detecting means is located in the vicinity of the probes 144 which penetrate the block 24. A lead tube 188 for the thermocouple 186 is led out through the through hole 158a of the upper ring 158, and is connected to a sensor 192. Further, the sensor 192 is connected to the main control unit 16 for controlling the operation of the supply unit 182.

A control circuit in the main control unit 16 is previously set such that it actuates the cooling gas supply unit 182 when a temperature detected by the thermocouple 186 attains, e.g., 60° C. or more, and stops the operation of the supply unit 182 when the detected temperature is lowered to 50° C. or more. In this case, compressed air or nitrogen gas is used as a cooling gas.

The temperature inside the block 24 is detected by means of the thermocouple 186, and a necessary amount of cooling gas is introduced into the block 24 in accordance with the detected temperature. The gas, warmed by the effect of cooling in the block 24, is discharged to the outside through the pipe 184 of the upper ring 158. In this manner, the temperature in the block 24 is always kept at 60° C. or less (preferably, at room temperature plus or minus 5° C). Thus, by testing semiconductor chips on the wafer W for electrical properties with the temperature of the probes 144 restrained from increasing, permanent deformation of the probes 144 by abnormal current, thermal damage of insulating films, etc. can be prevented.

The relationships between the current flowing through the supply potential probes 144, the flow of air as the cooling gas, and the temperature of the probes 144 were determined in general test conditions for semiconductor chips by using the probe apparatus shown in FIGS. 1 to 7. FIG. 8 shows the measurement results. In FIG. 8, the current is a value in mA for each three probes 144, and the temperature is represented in ° C. Lines L1, L2, L3, L4 and L5 represent cases for air flows of 0, 2.3, 3.4, 5.6, and 7.2 l/min, respectively. As shown in FIG. 8, the temperature of the probes 144 decreases with the increase of the air flow, thus demonstrating the effect of the cooling mechanism according to the present invention.

Alternatively, the cooling gas may be fed from the upper side of the block 24 and discharged from the flank of the block. Further, a plurality of cooling gas supply pipes may be connected to various parts of the block 24 so that the cooling gas are fed and discharged in a number of directions.

Referring now to FIGS. 1 to 4, the function of the fuse box 62 will be described.

If an overcurrent of, e.g., 500 mA or more flows through any of the probes 144 from any cause during the test of the chips on the wafer W, for example, the probes 144 may possibly be damaged. According to the present invention, however, the fuses 92 connected to the probes 144 are blown by heat from the current before the probes are damaged. Accordingly, the current supply to the probes 144 is stopped, so that the probes 144 are prevented from being broken.

If the fuses 92 are blown during the test, the pogo pin ring 32 and the test head 36 are first moved to a retreated position, and, if necessary, the cables 84a to 84c are removed from the terminals 82 on the top of the box 62. Then, the through screws 72 are loosened, and the lid 64 and the tray 66 are removed together from the baseplate 68. In this manner, all the fuses 92 are disengaged from the probe card 20.

Subsequently, the used tray 66 is replaced with a previously provided spare tray which contains an entire set of solid fuses. Then, the lid 64 and the new tray are attached to the baseplate 68, the pogo pin ring 32 and the test head 36 are restored to a testing position, and the test of the wafer chips is restarted. By doing this, the downtime of the apparatus can be shortened.

According to the arrangement of the present invention, the probe card 20, provided with the probes 144, and the fuse box 62, which holds the fuses 92, are located at a distance from each other. Even though the probes 144 used are numerous, therefore, the fuses 92 can be mounted correspondingly in number. One fuse may be provided for each probe, or otherwise, one fuse may be provided for each two probes or more, e.g., for each three probes as in the case of the first embodiment.

Figure 9:
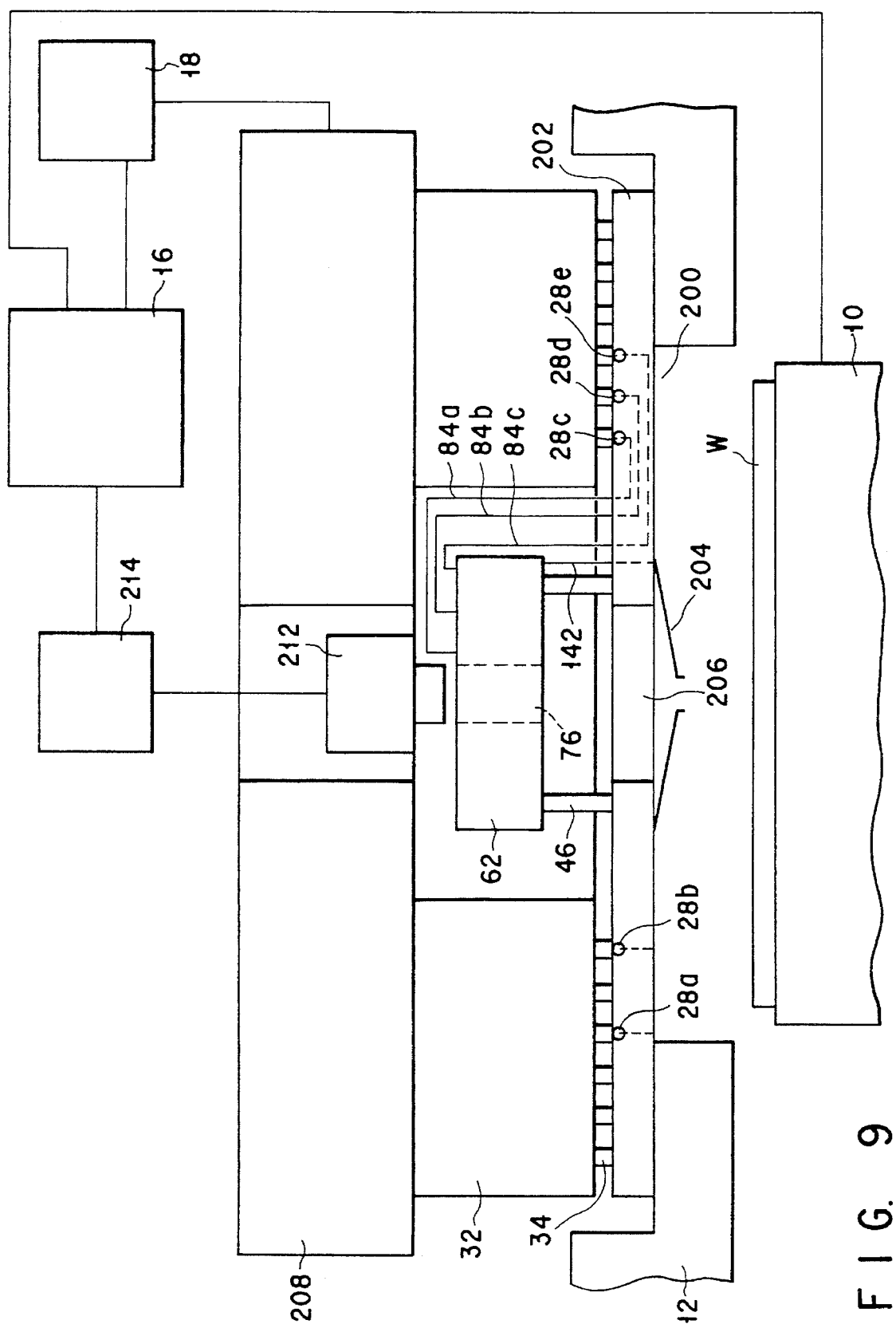
FIG. 9 is a side view schematically showing a probe apparatus according to a second embodiment of the present invention.

Referring to FIG. 9, there is shown a probe apparatus according to a second embodiment of the present invention, which is applied to a horizontal-type probe card. In FIG. 9, the same reference symbols are used to designate members which correspond to their counterparts in the first embodiment shown in FIG. 1, and those members will be described as required.

A probe card 200 is formed of a PCB 202 which includes a circular, rigid insulating substrate and a wiring patterns formed individually on the opposite sides of the substrate. The respective proximal ends of probes 204 are soldered to the conductor pattern on the lower surface of the PCB 202, while the respective free ends or distal ends of these probes are centralized. A circular opening 206 is formed in the center of the PCB 202, overlying the distal ends of the probes 204.

The signal and grounding pogo seats 28a and 28b, which are individually in contact with the pogo pins 34 of the pogo pin ring 32, are connected to the conductor pattern on the lower surface of the PCB 202 by means of through hole connectors, and are also connected individually to specific probes 204. Pogo seats 28c, 28d and 28e for the three different supply potentials are connected to the fuse box 62 by means of the conductor pattern on the upper surface of the PCB 202 and the cables 84a to 84c. The cables 142 from all the pogo pins 102 (see FIGS. 2 and 3) of the fuse box 62 are restored to the PCB 202, connected to the conductor pattern on the lower surface of the PCB 202 by means of through hole connectors, and further connected to specific probes 204.

An infrared camera 212, which is disposed in an opening in the center of the test head 36, is used to photograph the probes 204 through the respective center openings 76 and 206 of the fuse box 62 and the probe card 200. An image signal from the camera 212 is subjected to image processing in a temperature detecting unit 214, whereby the respective temperatures of the probes 204 are detected. Changes of the quantity of infrared rays emitted from the probes 204 are utilized for this processing. The temperature detecting unit 214 is further connected to the main control unit 16.

The respective temperatures of the probes 204 can be monitored by means of the camera 212 during the test of the chips of the wafer W. Hereupon, the temperatures of the probes 204, measured by means of the detecting unit 214, are compared with a previously inputted critical temperature of, e.g., 200° C. If the critical temperature is found to be exceeded by any of the temperatures of the probes 204 in the detecting unit 214, an abnormal signal is delivered to the main control unit 16. In response to this signal, the unit 16 shuts down the tester 18. Subsequently, the main control unit 16 orders the termination of the test of a chip being currently measured by the tester 18, and moreover, moves the mount 10 to be ready for the test of the next chip. On completion of this movement of the mount 10, the control unit 16 orders the tester 18 to start the test of the next chip. Through this operation, the probes can be prevented from being damaged, and the downtime of the apparatus can be shortened.

In the foregoing first embodiment, the tester is shut down, in accordance with the temperature of the probes detected by means of the thermocouple 186 shown in FIG. 6, to prevent the probes from being damaged in case of abnormal operation. Although the respective temperatures of the individual probes cannot be detected because no infrared camera is used in this case, an extraordinary temperature increase of the probes as a whole can be detected.

The present invention is not limited to the illustrated embodiment, and various changes and modifications may be effected therein by one skilled in the art without departing from the scope or spirit of the invention. For example, the ground potential may be supplied to the semiconductor chips through the mount 10, instead of probes. The above-described probe apparatus may be arranged such that coaxial cables are connected to the signal connecting posts 44, whereby a high-frequency response test and noise check can be conducted besides the regular test of the circuit operation. Further, the present invention is not limited to the use for semiconductor devices formed in semiconductor chips, and may be also applied to probing of semiconductor devices formed in LCD substrates.

What is claimed is:

1. A probe apparatus for examining an electrical characteristic of an object having a number of electrode pads, comprising:

a work table on which said object is placed;

a circuit board located above said work table and having wiring which is electrically connected to a tester;

means for relatively moving said work table and circuit board toward and away from each other;

a surrounding frame supported by said circuit board to project downward therefrom and having an opening opposite to said work table;

a wall member covering said opening of said surrounding frame;

a plurality of probe terminals to be respectively brought into contact with said electrode pads of said object, said probe terminals being arranged to protrude from a lower surface of said wall member and electrically connected to said wiring of said circuit board;

means for forming a cooling chamber, which is substantially closed, on an upper surface of said wall member by cooperating with said surrounding frame and said wall member;

means for supplying a cooling gas into said cooling chamber; and a discharge port for discharging said cooling gas from said cooling chamber.

2. The apparatus according to claim 1, wherein said discharge port is arranged so as to direct said cooling gas away from said work table.

3. The apparatus according to claim 2, wherein said cooling air is introduced into said cooling chamber through a side portion thereof and is discharged from a top portion thereof.

4. The apparatus according to claim 1, further comprising detecting means for detecting a temperature in said cooling chamber and means for controlling a supply of said cooling gas in accordance with a measured temperature obtained by said detecting means.

5. The apparatus according to claim 1, further comprising detecting means for detecting a temperature in said cooling chamber and means for controlling said tester to stop an examination when a reference temperature is exceeded by a measured temperature obtained by said detecting means.

6. The apparatus according to claim 1, wherein a plurality of said probe terminals and said wiring of said circuit board are connected through fuses, respectively.

7. The apparatus according to claim 1, further comprising a test head connected to said tester, a pogo pin ring having pogo pins connected to said test head, and pogo seats arranged on said circuit board and connected to said wiring, the pogo seats corresponding in position to said pins, respectively, so as to come into releasable contact with said pogo pins, wherein said tester and said wiring of said circuit board are connected through said test head, pogo pins and pogo seats.

8. The apparatus according to claim 7, wherein said circuit board is fixed at a position, said test head and said pogo pin ring being integrally moveable toward and away from said circuit board, and work table, along with said object, being moveable toward and away from said probe terminals.

9. The apparatus according to claim 8, wherein said probe terminals comprise ends of probe needles, respectively.

10. The apparatus according to claim 9, wherein said probe needles vertically pass through said cooling chamber.

* * * * *